US009720021B2

(12) United States Patent
Waugh et al.

(10) Patent No.: US 9,720,021 B2
(45) Date of Patent: Aug. 1, 2017

(54) APPARATUS AND METHOD FOR SELECTING OPTIMUM ELECTRICAL POWER CONVERTER FOR VARIABLE POWER SOURCE

(71) Applicant: Inventus Holdings, LLC, Juno Beach, FL (US)

(72) Inventors: Daniel E. Waugh, Royal Palm Beach, FL (US); Christopher D. Wright, Hobe Sound, FL (US)

(73) Assignee: INVENTUS HOLDINGS, LLC, Juno Beach, FL (US)

( * ) Notice: Subject to any disclaimer, the term of this patent is extended or adjusted under 35 U.S.C. 154(b) by 492 days.

(21) Appl. No.: 13/729,217

(22) Filed: Dec. 28, 2012

(65) Prior Publication Data
US 2014/0184193 A1    Jul. 3, 2014

(51) Int. Cl.
*G01R 21/06*    (2006.01)
*H02J 3/38*    (2006.01)
*H02S 50/10*    (2014.01)
*H02J 3/00*    (2006.01)
*H02S 50/00*    (2014.01)

(52) U.S. Cl.
CPC .............. *G01R 21/06* (2013.01); *H02J 3/383* (2013.01); *H02S 50/10* (2014.12); *H02J 2003/007* (2013.01); *H02S 50/00* (2013.01); *Y02E 10/563* (2013.01); *Y02E 60/76* (2013.01); *Y04S 40/22* (2013.01)

(58) Field of Classification Search
CPC ........... G01R 21/06; H02J 3/383; H02S 50/10
USPC ..................................... 324/76.11
See application file for complete search history.

(56) References Cited

U.S. PATENT DOCUMENTS

| 4,999,524 | A | 3/1991 | Williams et al. | |
|---|---|---|---|---|
| 7,231,282 | B2 | 6/2007 | Schubert et al. | |
| 8,180,622 | B2 | 5/2012 | Nasle | |
| 2006/0273770 | A1* | 12/2006 | Siri | ............... 323/272 |
| 2010/0057428 | A1 | 3/2010 | Jeschin | |

(Continued)

FOREIGN PATENT DOCUMENTS

| CN | 101315642 | 12/2008 |
|---|---|---|
| DE | 10 2007 052 980 | 5/2009 |
| KR | 20080028605 | 4/2008 |

OTHER PUBLICATIONS

Blanchette, Handy et al., The impact of power converter technologies on stand alone wind turbine applications, IEEE Canada Elec. Power Conf., 2007, p. 68-73.*

(Continued)

*Primary Examiner* — Thomas Valone
(74) *Attorney, Agent, or Firm* — Feldman Gale, P.A.

(57) ABSTRACT

A method and apparatus use a programmable logic circuit to receive data representing environmental conditions such as irradiance, temperature, wind, snow, elevation, and the like, in a given location, to provide an input signal to a simulated variable power source which produces an output that approximates the output of a variable power source such as a photovoltaic panel that is subject to such environmental conditions. Power from the simulated variable power source is separately directed to each of a number of power converters and the efficiency of each power converter is tested to determine the optimum power converter for use with the variable power source in the given location.

12 Claims, 2 Drawing Sheets

(56) References Cited

U.S. PATENT DOCUMENTS

2011/0040550 A1 2/2011 Graber et al.
2012/0139351 A1 6/2012 Wang
2012/0281444 A1* 11/2012 Dent .......................... 363/56.01

OTHER PUBLICATIONS

Mattsson, Valtteri, Comparison of calorimetric and electrical loss measurement methods in a frequency converter reserach and development application, Energy Conv. Congress and Exposition, 2011, p. 1026-1030.*

Huijuan Li, et al.; "Adaptive Voltage Control With Distributed Energy Resources: Algorithm, Theoretical Analysis, Simulation, and Field Test Verification;" IEEE Transactions on Power Systems; Aug. 2010; pp. 1638-1647; vol. 25; Issue 3 (Abstract Only).

* cited by examiner

APPARATUS AND METHOD FOR SELECTING OPTIMUM ELECTRICAL POWER CONVERTER FOR VARIABLE POWER SOURCE

BACKGROUND OF THE INVENTION

Electrical power from photovoltaic (PV) panels, wind turbines, and other sources of electrical power tends to be variable, depending upon real-time environmental conditions including temperature, luminescence, cloud cover, snow, wind velocity, and any other relevant factors. Electricity produced by such power sources must be converted from its native delivery state, such as direct current or variable frequency alternating current, to the U.S. standard of 60 Hz alternating current (or, in many countries, 50 Hz alternating current) before the power can be supplied to a power grid.

Power converters are available in a variety of capacities, and the efficiency of power conversion is an important factor in designing and installing new variable power sources. Thus, the choice of a power converter of a specific size or capacity may impact the efficiency of power generation and delivery, and presents challenges in the planning and design stages of any new variable power facility. Power sources located in different environments, such as, for example, southwest desert or forested mountainous regions, have different outputs that may be optimized by using a power converter whose energy yield and efficiency are greater than other power converters operating in the same environment. However, absent a side-by-side comparison, it is difficult to determine which of a variety of power converters will provide the optimal performance. What is needed is a way to determine what power converter will provide optimal efficiency for a specific power source type that will be installed in a predetermined location.

SUMMARY OF THE INVENTION

The invention is a simulation system that can be located in a laboratory or other similar testing facility, and that is programmed to provide a variable power source with inputs that are based on real-time environmental conditions for a given location. Inputs may include actual, recorded meteorological data (temperature, sunlight, wind speed and direction, etc.) which, in a preferred embodiment, would be provided to a programmable logic circuit (PLC), but could also be provided by a desktop computer, laptop computer, or other microprocessor device, or which may be based on manually programmed input. The PLC then controls a simulated variable power supply whose output is directed to one or more power converters. Measurements taken at the input and output for each power converter are analyzed to determine which power converter provides the greatest energy yield and efficiency. Simulations may be run in parallel, or may be run consecutively using the same programmed input data. The invention may be used in the planning of a site for the generation of electrical power, or may be used to upgrade the efficiency of existing sites.

In an alternative embodiment, historical data to be sent to simulated variable power source may be taken directly from an existing variable power source situated at the locale in which a power converter is to be used or upgraded. For example, if a PV variable power source has been installed at a location, and has provided power for some length of time, records representing the power output of the device can be used to generate an input to a simulated variable power source without the necessity of using recorded weather data. In this embodiment, the simulated variable power source may simply provide a power output to various power converters as previously described, and an analysis of the efficiency of each power converter may be used to select the optimum power converter to be used, or upgraded, for the locale.

DETAILED DESCRIPTION OF THE PREFERRED EMBODIMENTS

Figure 1:
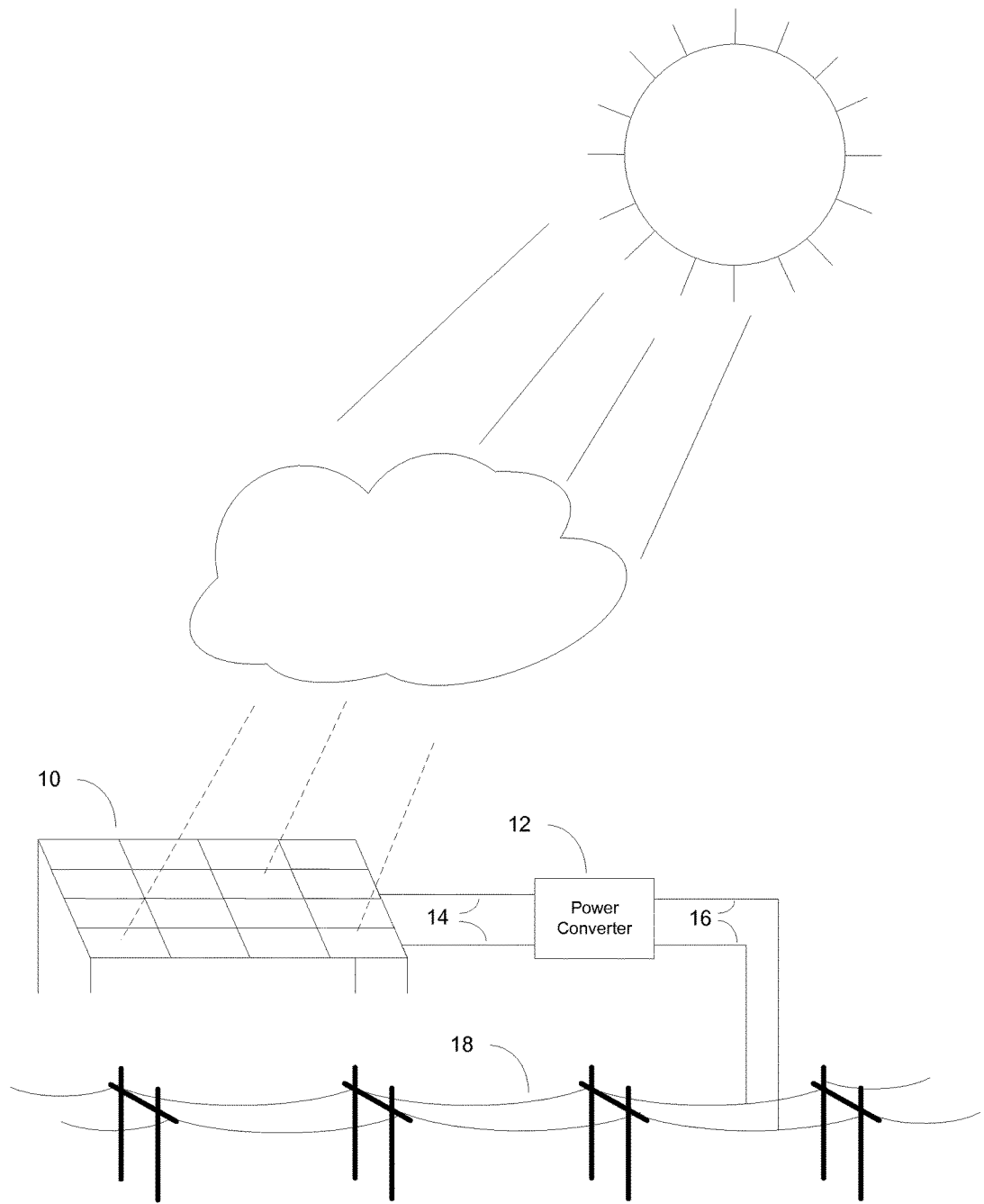
FIG. 1 depicts the problem to be solved as it relates to a photovoltaic solar panel.

FIG. 1 illustrates an installation having a variable power supply in the form of a photovoltaic (PV) panel 10 whose immediate electrical output is in the form of a direct current 14 of variable power. A power converter 12 receives direct current (DC) power 14 from the PV panel and converts it to 60 Hz alternating current (AC) power 16 before placing it on a transmission line or power grid 18.

Figure 2:
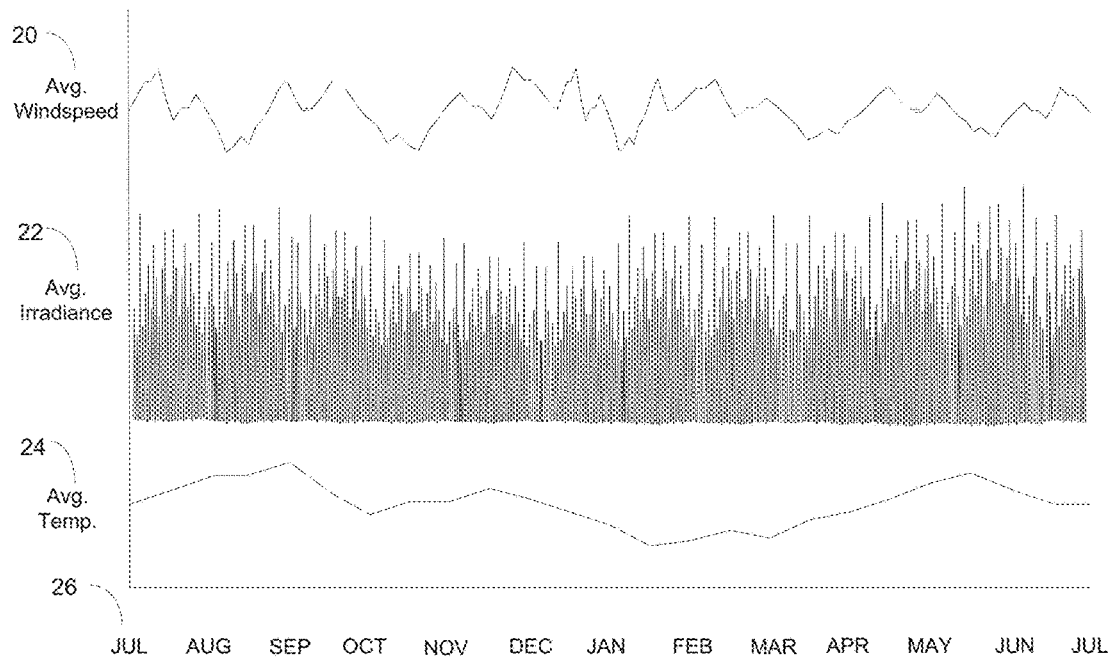
FIG. 2 is a chart depicting parameters to be determined and supplied to the PLC as inputs to the variable power source.

FIG. 2 is a series of graphs spanning a 12-month period, and providing representative recorded values for such relevant parameters as windspeed 20, irradiance 22, and temperature 24. Other parameters may include snowfall, rainfall, and dust in locations in which these factors may affect the output of a PV panel. Measurements are taken over a relevant time period that, in a preferred embodiment, will exceed at least one year. In FIG. 2, the time scale 26 shows data extending over a 12-month period.

It should be noted that, while parameters relevant to a PV panel are shown and described, the invention is not so limited, but may encompass these and other parameters relevant to the output of other variable power sources such as, for example, wind turbines. In FIG. 2, historical data is used to program a PLC 30 which can mimic the weather data and apply algorithms to generate an input signal for a power source whose output can be modulated to conform to the input signal.

Figure 3:
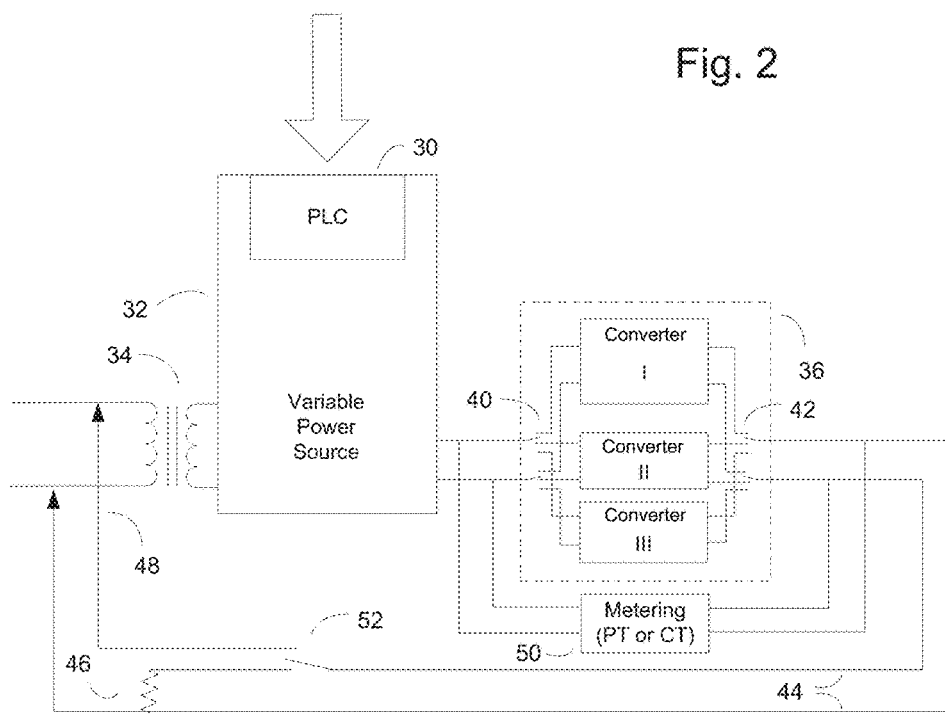
FIG. 3 is a simplified schematic diagram of the invention using inputs from the chart depicted in FIG. 2.

FIG. 3 depicts a simplified schematic diagram 38 showing a variable power source 32 that receives an input signal 28 from a PLC 30. The PLC may be a separate component, or may be integrated into the variable power source. The signal from the PLC is based upon weather parameters as previously noted, and causes the variable power source to provide more power, or less power, as indicated by the input signal. Power is supplied to the variable power source 32 through a transformer 34 connected to a power grid. Power from the variable power source 32 is the passed through a number of power converters 36, one at a time, and the power converter output 44 is received by either a load bank of resistors 46 or may be sent back to the power grid 48. In FIG. 3, a switch 52 is shown as a means for directing the output of the power converter being tested to a load bank of resistors 46 or to the power grid 48.

In either case, the input and output of the power converter are analyzed by metering equipment 50 that may include a potential transformer (PT) or a current transformer (CT), and the efficiency of the power converter being tested is compared with the efficiencies of other power converters to determine which power converter provides optimal efficiency under the weather parameters indigenous to the specified location where the data were gathered. The input and output of the power converter may include such parameters as voltage, current, power, phase, or any other electrical measurement necessary to assess the efficiency of the power converter. In FIG. 3, three power converters (marked I, II and III) are being compared. Input and output switches, 40 and 42, direct power from the variable power source 32 through each power converter separately, and measurements of each power converter's efficiency may be compared with that of the others. Although FIG. 3 shows three power converters which may be individually selected at the throw of a switch, a more likely deployment for evaluating the output of the power converters is a setup that tests one converter at a time. Converters would be tested days, weeks, or months apart and have their results compared. Such an analysis would produce accurate results, since the inputs were the same.

As this simulation and analysis can be done in a laboratory remote from the proposed or actual installation, and the most efficient power converter can be selected, this invention allows the design and efficiency to be determined before an installation or, in some cases, a retro fit or upgrade, takes place. Time, money, and resources may be enhanced where the invention is used.

As an alternative means of providing input to the variable power source, historically collected data may be manually entered into the system, and the most efficient power converter may be determined using such data.

Persons of ordinary skill in the art will understand that the invention has been shown and described in a number of embodiments, but is not restricted to only those embodiments and is limited only by the claims appended hereto.

We claim:

1. A method for selecting a power converter to be used with a variable power source at an installation location, said method comprising:
    providing a variable power source;
    determining an installation location of the variable power source;
    recording measured data associated with weather parameters at the installation location, the weather parameters comprising at least air temperature;
    converting the measured data into a first signal, wherein the first signal is representative of a power output from the variable power source responsive to the weather parameters;
    providing a simulated computer-based variable power source with a simulated power output responsive to an input including a second signal;
    applying the first signal representing a power output from the variable power source as the input of the second signal to the simulated computer-based variable power source to cause the power output of the simulated computer-based variable power source to approximate the power output that would be produced by the variable power source responsive to the weather parameters;
    iteratively performing for each power converter in a set of two or more power converters with the simulated computer-based variable power source each of
        a) connecting the simulated variable power source to a selected power converter in the one of the set of two or more power converters;
        b) measuring electrical parameters comprising at least voltage and amperage at an input and an output of the selected power converter;
        c) determining an efficiency of the selected power converter;
        d) determining if another of the power converters from the set of two or more power converters has not yet been measured and
    in response to another of the power converters of the set of two or more power converters remains to be measured, repeating steps a, b, c, d, with another power converter as the selected power converter, otherwise
        selecting a high efficiency power converter for the recorded measured data associated with the weather parameters to be used with the variable power source based upon a comparison of the efficiency of each of the power converters in the set of two or more power converters;
        installing the power converter selected from the set of two or more power converters at the installation location responsive to the selecting the high efficiency power converter; and
        connecting the selected power converter from the set of two or more power converters to the variable power source at the installation location.

2. The method of claim 1 further comprising directing the power output of each power converter in a set of two or more power converters to a load bank of resistors when determining the efficiency of the selected power converter.

3. The method of claim 1 further comprising directing the power output of each power converter in a set of two or more power converters to a power grid when determining the efficiency of the selected power converter.

4. The method of claim 1 wherein the variable power source comprises a photovoltaic panel.

5. The method of claim 1 wherein the variable power source comprises a wind turbine.

6. The method of claim 1 further comprising:
    providing an additional variable power source;
    determining an installation location of the additional variable power source;
    recording measured data associated with weather parameters at the installation location, the weather parameters for the additional variable power source different than the weather parameters for the variable power source;
    converting the measured data into a third signal, wherein the first signal is representative of a power output from the additional variable power source responsive to the weather parameters;
    providing a simulated computer-based variable power source with a simulated power output responsive to an input including a fourth signal;
    applying the third signal representing a power output from the additional variable power source as the input of the fourth signal to the simulated computer-based variable power source to cause the power output of the simulated computer-based variable power source to approximate the power output that would be produced by the additional variable power source responsive to the weather parameters;
    iteratively performing for each power converter in the set of two or more power converters with the simulated computer-based variable power source each of
        e) connecting the simulated variable power source to a selected power converter in the one of the set of two or more power converters;

f) measuring electrical parameters comprising at least voltage and amperage at an input and an output of the selected power converter;

g) determining an efficiency of the selected power converter;

h) determining if another of the power converters from the set of two or more power converters has not yet been measured and in response to another of the power converters of the set of two or more power converters remains to be measured, repeating steps e, f, g, h, with another power converter as the selected power converter, otherwise selecting a high efficiency power converter for the recorded measured data associated with the weather parameters to be used with the additional variable power source based upon a comparison of the efficiency of each of the power converters in the set of two or more power converters;

installing the power converter selected from the set of two or more power converters at the second installation location responsive to the selecting the high efficiency power converter; and connecting the selected power converter from the set of two or more power converters to the additional variable power source at the second installation location, whereby the power converted installed at the installation location is selected based upon measured efficiency of simulated performance under weather conditions at the first installation location and the power converter selected for installation at the second installation is selected based upon measured efficiency of simulated performance under weather conditions at the second installation location.

7. A method for selecting a first power converter to be used with a variable power source and a second power converter to be used with a second variable power source, said method comprising:

identifying a first variable power source and a first installation location of the first variable power source;

recording data representing actual power output from the first variable power source situated in the first installation location;

converting the data into a first signal representing actual power output from the first variable power source;

applying the first signal as an input to a simulated variable power source whose simulated power output is responsive to the first signal such that the simulated power output approximates a power output that was actually produced by the first variable power source;

connecting the simulated variable power source to a first power converter, and, responsive to said connecting, measuring electrical parameters comprising at least voltage and amperage at the input and output of the first power converter, and determining a first efficiency of the first power converter;

substituting another power converter for the first power converter and repeating said connecting and, responsive to said repeating, measuring electrical parameters comprising at least voltage and amperage at the input and output of the another power converter, and determining a second efficiency of the another power converter; and selecting a specific power converter to be used with the first variable power source at the first installation location based upon a comparison of the first efficiency and the second efficiency to identify a high efficiency power converter;

identifying a second variable power source and a second installation location of the second variable power source;

recording data representing actual power output from the second variable power source situated in the second installation location wherein the second installation location has different weather parameters from the first installation location;

converting the data into a second signal representing actual power output from the second variable power source;

applying the second signal as an input to a simulated variable power source whose simulated power output is responsive to the second signal such that the simulated power output approximates a power output that was actually produced by the second variable power source;

connecting the simulated variable power source to the first power converter, and, responsive to said connecting, measuring electrical parameters comprising at least voltage and amperage at the input and output of the first power converter, and determining a first efficiency of the first power converter;

substituting another power converter for the first power converter and repeating said connecting and, responsive to said repeating, measuring electrical parameters comprising at least voltage and amperage at the input and output of the another power converter, and determining a second efficiency of the another power converter; and selecting a specific power converter to be used with the second variable power source at the second installation location based upon a comparison of the first efficiency and the second efficiency to identify a high efficiency power converter.

8. The method of claim 7 further comprising simulating the simulated variable power source being connected to a power grid.

9. The method of claim 7, further comprising directing the output of the first power converter and the another power converter to a load bank of resistors.

10. The method of claim 7, further comprising directing the output of the first power converter and the another power converter to a power grid.

11. The method of claim 7, wherein the first variable power source and the second variable power source comprises a photovoltaic panel.

12. The method of claim 7 wherein the first variable power source and the second variable power source.

* * * * *